United States Patent

Sanada

[11] Patent Number: 5,850,404
[45] Date of Patent: Dec. 15, 1998

[54] FAULT BLOCK DETECTING SYSTEM USING ABNORMAL CURRENT

[75] Inventor: Masaru Sanada, Tokyo, Japan

[73] Assignee: NEC Corporation, Tokyo, Japan

[21] Appl. No.: 954,990

[22] Filed: Jun. 6, 1997

Related U.S. Application Data

[63] Continuation of Ser. No. 588,136, Jan. 18, 1996, abandoned.

[30] Foreign Application Priority Data

Jan. 20, 1995 [JP] Japan ..................................... 7-026175

[51] Int. Cl.$^6$ .................................................. G06F 11/00
[52] U.S. Cl. ................................................ 371/28; 371/24
[58] Field of Search ............................. 371/26, 28, 25.1, 371/22.1, 22.6, 24, 27.1, 27.5

[56] References Cited

U.S. PATENT DOCUMENTS

| | | | |
|---|---|---|---|
| 3,772,595 | 11/1973 | De Wolf et al. ........................ | 371/25.1 |
| 4,710,704 | 12/1987 | Ando .................................. | 324/103 R |
| 4,922,445 | 5/1990 | Mizoue et al. .......................... | 364/578 |
| 5,321,354 | 6/1994 | Ooshima et al. ....................... | 324/765 |
| 5,483,170 | 1/1996 | Beasley et al. ......................... | 324/537 |

FOREIGN PATENT DOCUMENTS 41 17 493 A1 12/1992 Germany .
43 05 288 A1 8/1994 Germany .

OTHER PUBLICATIONS

New Application of Laser Beam to Failure Analysis of LSI With Multi–Metal Layers, by M. Sanada, Microelectron. Reliab., vol. 33, No. 7, pp. 993–1009, 1993.

"Evaluation and Detection of CMOS–LSI With Abnormal IDDQ," by M. Sanada, Microelectron. Reliab., vol. 35, No. 3, pp. 619–629, 1995.

*Primary Examiner*—Albert Decady
*Attorney, Agent, or Firm*—Foley & Lardner

[57] ABSTRACT

In a semiconductor device formed by a plurality of logic blocks, a plurality of functional test patterns are generated and transmitted to the semiconductor device, and it is determined whether an abnormal current flows through the semiconductor device. When an abnormal current is detected, a fault block is determined in accordance with a table for storing the functional test patterns and the logic blocks operated by the functional test patterns.

14 Claims, 21 Drawing Sheets

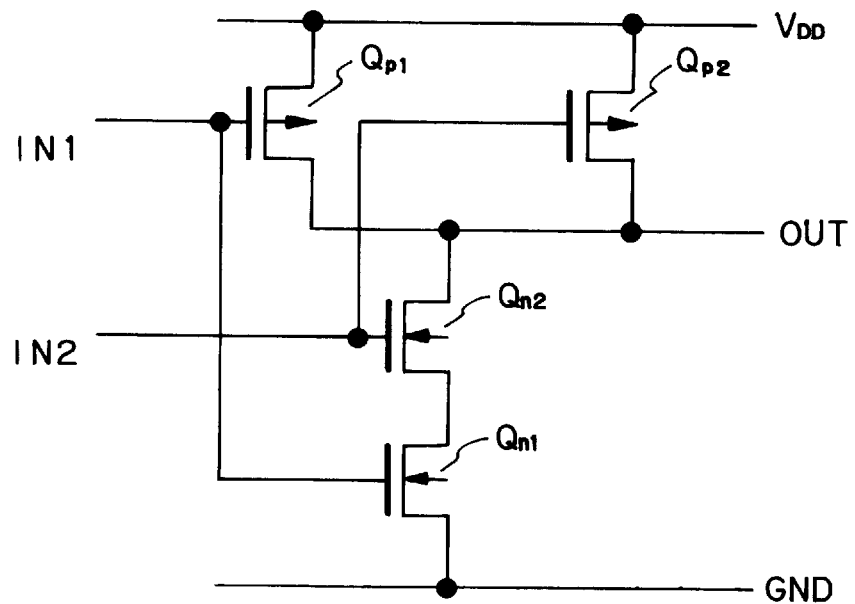

| IN1 | IN2 | OUT |
|-----|-----|-----|
| H | H | H |
| H | L | H |
| L | H | H |
| L | L | H |

Fig. 4

| FTP(ADD) | OPERATED BLOCKS |
|---|---|
| FTP(0) | $B_1, B_3, B_6, B_a, B_f$ ——— , $B_z$ |
| FTP(1) | $B_3, B_f, B_g, B_h, B_k$ ——— , $B_y$ |
| FTP(2) | $B_1, B_3, B_6, B_a, B_c,$ ——— , $B_x$ |
| ⋮ | |
| FTP(MAX) | $B_3, B_6, B_8, B_9, B_a,$ ——— , $B_z$ |

Fig. 7

|  | $B_1$ | $B_2$ | $B_f$ | --- | $B_z$ |
|---|---|---|---|---|---|
| FTP(a) | ○ | ○ | ○ |  | ○ |
| FTP(b) | − | ○ | ○ |  | − |
| FTP(c) | − | − | ○ |  | − |
| ⋮ |  |  |  |  |  |
| FTP(j) | − | − | ○ |  | − |

Fig. 17

| | EXTRACTED BLOCKS | |
|---|---|---|
| FTP(a) | $B_1$, $B_2$, $B_6$, $B_a$, $B_f$, -------- $B_z$ | ← I |
| FTP(b) | —, $B_2$, —, —, $B_f$, -------- — | ← II |
| FTP(c) | l, —, l, l, $B_f$, ------- l | ← III |
| ⋮ | ⋮ | |
| FTP(j) | l, l, l, l, $B_f$, ------- l | ← IV |

Fig. 19

| | EXTRACTED BLOCKS | |
|---|---|---|
| FTP(a) | $B_1, B_2, B_6, B_a, B_f, ---B_i---B_z$ | ← I |
| FTP(b) | $—, B_2, —, B_a, B_f, ---B_i---B_z$ | ← II |
| ⋮ | ⋮ | |
| FTP(d+1) | $\mid, B_2, \mid, B_a, B_f, --- \mid --- \mid$ | ← III |
| FTP(j) | $B_f$ | ← IV |

5,850,404

FAULT BLOCK DETECTING SYSTEM USING ABNORMAL CURRENT

This application is a continuation of application Ser. No. 08/588,136, filed Jan. 18, 1996, now abandoned.

BACKGROUND OF THE INVENTION

1. Field of the Invention

The present invention relates to a system for detecting a fault block in a semiconductor device such as a CMOS device formed by a plurality of logic blocks.

2. Description of the Related Art

In a prior art system for testing a semiconductor device, the device is driven by using a functional test pattern, and as a result, an output pattern is obtained at the outputs of the device. Then, the output pattern is compared with an expected pattern. Thus, a determination of whether or not the device is normal or abnormal is made based on whether or not the output pattern coincides with the expected pattern.

After it is determined that the device is abnormal, a fault point is estimated in accordance with a fault dictionary for storing a relationship between functional test patterns and output patterns for virtual faults.

The fault dictionary is made by carrying out fault simulation.

In the above-described prior art testing apparatus, however, when the device is highly-integrated, a large amount of fault simulations are required to complete the fault dictionary.

In addition, the volume of the fault dictionary is very large. For example, $$V_0 \propto L^{2-3}$$

where $V_0$ is the volume of the fault dictionary; and
L is a number of logic circuits in the device.

Thus, it is substantially difficult to determine a fault point of a highly-integrated semiconductor device.

SUMMARY OF THE INVENTION

It is an object of the present invention to be able to effectively determine a fault point of a highly-integrated semiconductor device.

According to the present invention, in a semiconductor device formed by a plurality of logic blocks, a plurality of functional test patterns are generated and transmitted to the semiconductor device, and it is determined whether an abnormal current flows through the semiconductor device. When an abnormal current is detected, a fault block is determined in accordance with a table for storing the functional test patterns and the logic blocks operated by the functional test patterns.

After the fault block is determined, a fault point within the fault block is estimated by the prior art testing system. In this case, the prior art testing system does not need a large fault dictionary.

BRIEF DESCRIPTION OF THE DRAWINGS

The present invention will be more clearly understood from the description as set forth below, in comparison with the prior art, with reference to the accompanying drawings, wherein:

FIG. 1A is a circuit diagram illustrating a normal two-input CMOS NAND circuit;

FIG. 1B is a truth table of the NAND circuit of FIG. 1A;

FIG. 4 is a table showing a relationship between functional test patterns and operated blocks;

FIG. 7 is a table showing transition blocks extracted by the operation of the flowchart of FIG. 6 when an abnormal current $I_{ddq}$ is detected;

FIG. 17 is a table showing transition blocks extracted by the operation of the flowchart of FIG. 16 when an abnormal current $I_{ddq}$ is detected;

FIG. 19 is a table showing transition blocks extracted by the operation of the flowchart of FIG. 18 when an abnormal current $I_{ddq}$ is detected;

DESCRIPTION OF THE PREFERRED EMBODIMENT

First, a principle of the present invention will be explained with reference to FIGS. 1A, 1B, 2A and 2B.

In FIG. 1A, which illustrates a normal two-input CMOS NAND circuit, P-channel MOS transistors $Q_{p1}$ and $Q_{p2}$ are connected in paralled between a power supply terminal $V_{DD}$ and an output terminal OUT, and N-channel MOS transistors $Q_{n1}$ and $Q_{n2}$ are connected in series between the output terminal OUT and a ground terminal GND. The transistors $Q_{p1}$ and $Q_{n1}$ are controlled by the voltage of an input terminal IN1, and the transistors $Q^{p2}$ and $Q_{n2}$ are controlled by the voltage of an input terminal IN2. The truth table of the NAND circuit of FIG. 1A is shown in FIG. 1B.

In FIG. 1A, there is not a quiescent $V_{DD}$ supply current $I_{ddq}$ flowing from the power supply terminal $V_{DD}$ to the ground terminal GND. That is, the quiescent $V_{DD}$ supply current $I_{ddq}$ is in a normal state.

Figures 2A, 2B:
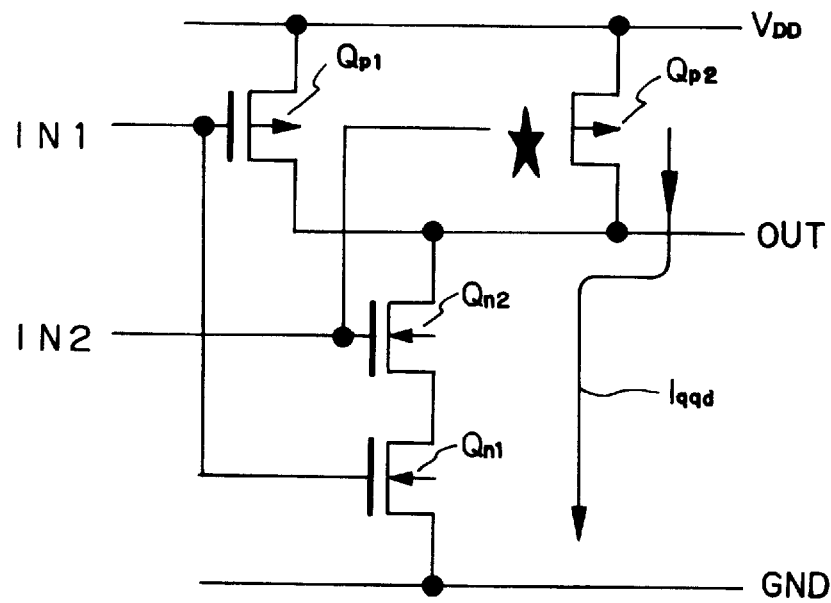
FIG. 2A is a circuit diagram illustrating an abnormal two-input CMOS NAND circuit.
FIG. 2B is a truth table of the NAND circuit of FIG. 2A.

In FIG. 2A, which illustrates an abnormal two-input CMOS NAND circuit, assume that the gate of the P-channel transistor $Q_{p2}$ is open, so that the P-channel transistor $Q_{p2}$ is in a normally ON state. As a result, when the voltages at the input terminals IN1 and IN2 are both high, a penetration current, i.e., a large quiescent $V_{DD}$ supply current $I_{qqd}$ flows. That is, the quiesent $V_{DD}$ supply current $I_{ddq}$ is in an abnormal state.

Also, in FIG. 2A, when the voltages at the input terminals IN1 and IN2 are both high, the voltage $V_{out}$ at the output terminal OUT is $$V_{out}=V_{DD}\cdot(2Z_n)/(Z_p+2\cdot Z_n)>V_{th}$$

where $Z_p$ is an impedance of the P-channel transistor $Q_{p2}$;
$Z_n$ is an impedance of each of the N-channel transistors $Q^{n1}$ and $Q_{n2}$; and
$V_{th}$ is a logic threshold voltage of a CMOS inverter.

Therefore, the truth table of the NAND circuit of FIG. 2A is shown in FIG. 2B.

Thus, generally, if a semiconductor device such as a CMOS device has a physical defect therein, an abnormal quiescent $V_{DD}$ supply current flows therethrough (see: M. Sanada, "New Application of Laser Beam to Failure Analysis of LSI with Multi-Metal Layers", Microelectronics and Reliability, Vol. 33, No. 7, pp. 993–1009, 1993, and M. Sanada, "Evalution and Detection of CMOS-LSI with Abnormal IDDQ", Microelectronics and Reliability, Vol. 35, No. 3, pp. 619–629, 1995).

Figure 3:
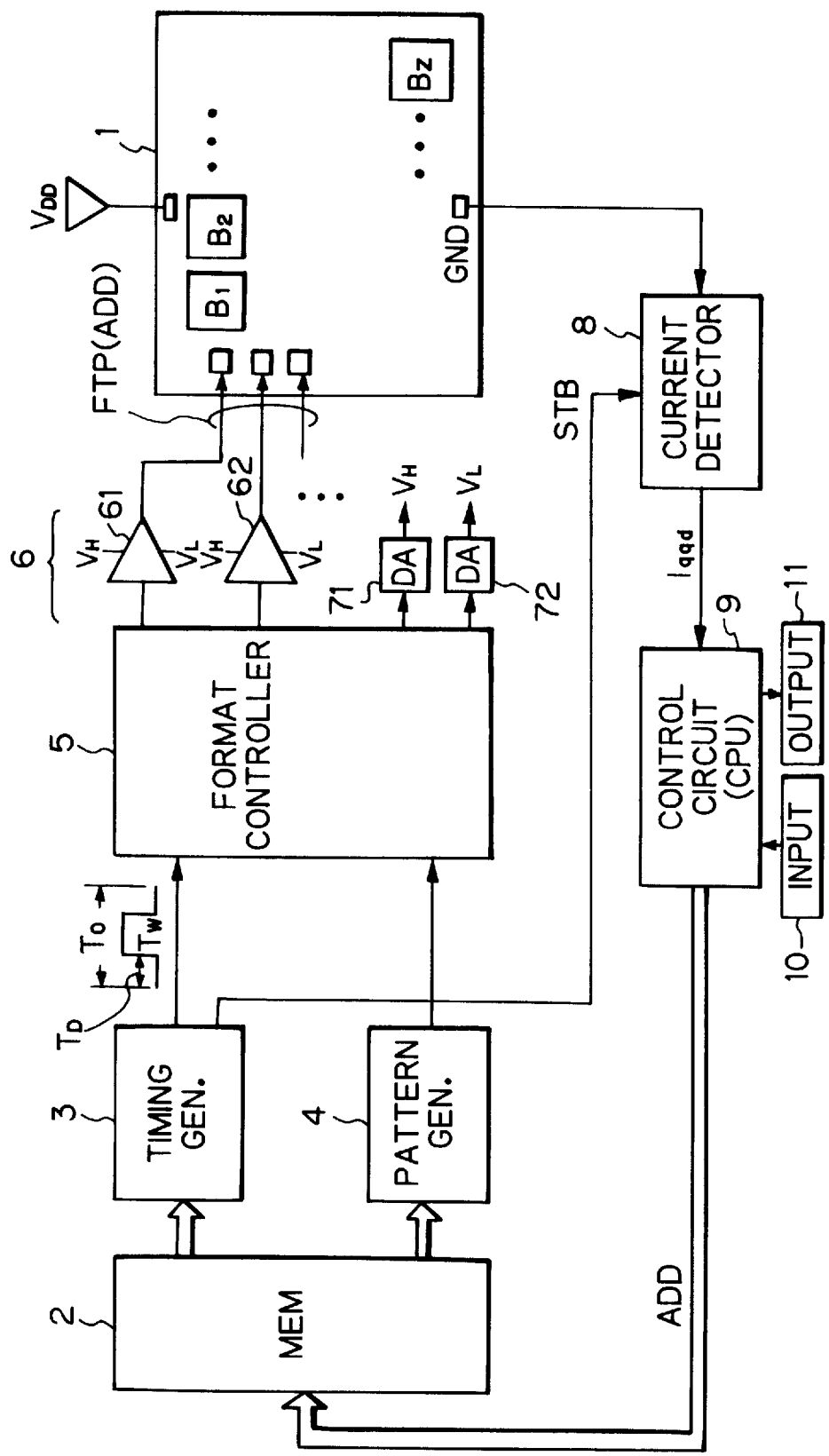
FIG. 3 is a block circuit diagram illustrating an embodiment of the fault block detecting apparatus according to the present invention.

In FIG. 3, which illustrates an embodiment of the present invention, reference numeral 1 designates a semiconductor device such as a CMOS LSI device including a plurality of logic blocks $B_1, B_2, \ldots B_z$. The semiconductor device 1 is supplied with a functional test pattern (FTP). The functional test pattern is generated by a memory 2, a timing generating circuit 3, a pattern generating circuit 4, a format controller 5, and PIN electronics units 61, 62, ... connected to input pads of the semiconductor device 1.

The timing generating circuit 3 generates a timing signal for defining a test rate TO, a delay time $T_D$ and a pulse width $T_w$. Also, the timing generating circuit 3 generates a strobe signal STB and transmits it to a current detector 8 for detecting a quiescent $V_{DD}$ supply current $I_{ddq}$ flowing through from a power supply terminal $V_{DD}$ to a ground terminal GND in the semiconductor device 1.

The pattern generating circuit 4 generates an actual pattern signal in accordance with data read out of the memory 2 which is generally compressed.

Each of the PIN electronics units 61, 62, ... is powered by voltages $V_H$ and $V_L$ which are generated by digital/analog (D/A) converters 71 and 72, respectively. For example, when "0" is supplied to the PIN electronics unit 61, the voltage $V_L$ (=0 V) is applied to the corresponding input pad. When "1" is supplied to the PIN electronics unit 61, the voltage $V_H$ is applied to the corresponding input pad.

The memory 2 receives an address signal SADD from a control circuit 9 which is comprised of a central processing unit (CPU), ROMs, RAMs, and the like. Therefore, if the content ADD of the address signal SADD is incremented by the control circuit 9, functional test patterns are sequentially generated and are transmitted to the semiconductor device 1. Simultaneously, the control circuit 9 monitors a quiescent $V_{DD}$ supply current $I_{ddq}$ flowing through the semiconductor device 1 through the current detector 8.

Also, connected to the control circuit 9 are an input apparatus 10 such as a keyboard or other controllers, and an output apparatus 11 such as a CRT.

Stored in the RAM of the control circuit 9 is a table showing a relationship between functional test patterns FTP (ADD) and operable blocks operated by the functional test patterns FTP (ADD) as shown in FIG. 4. Note that such blocks are designed by using application specific integrated circuits (ASIC) technology such as gate array technology, and therefore, the above-mentioned relationship can be recognized in advance.

Figure 5:
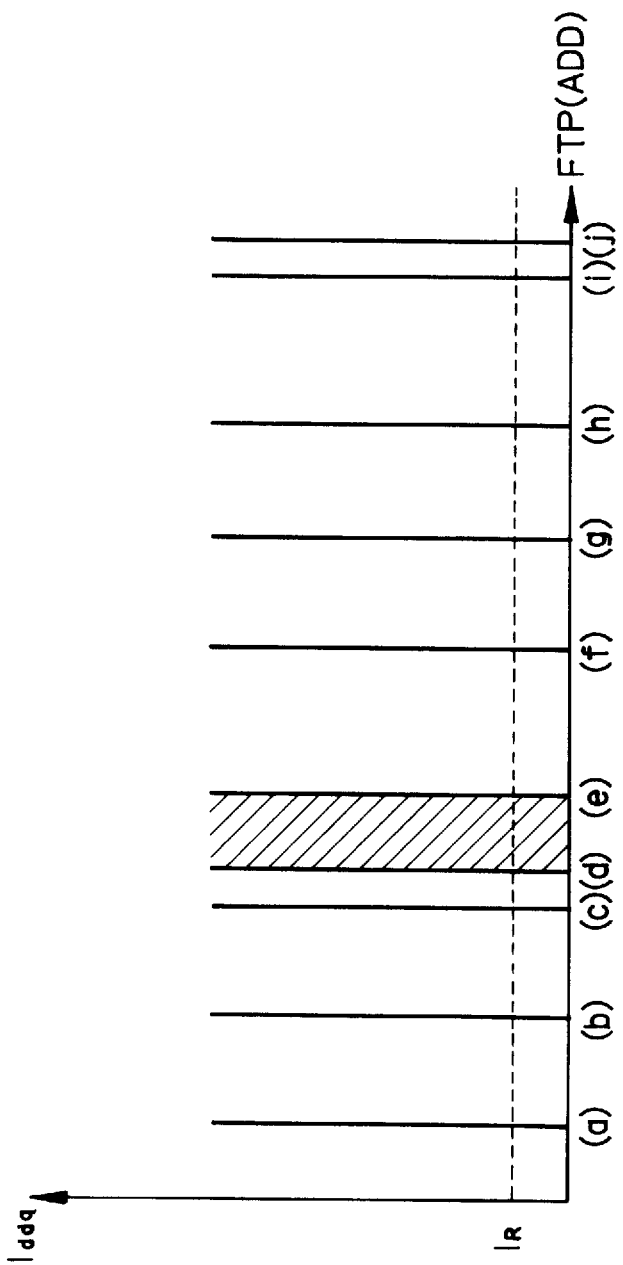
FIG. 5 is a graph showing an example of quiescent $V_{DD}$ supply current ($I_{ddq}$)

In FIG. 5, which shows examples of quiescent $V_{DD}$ supply current ($I_{ddq}$) versus functional test patterns FTP (ADD), the current $I_{ddq}$ is extremely large, i.e., abnormal, when the functional test patterns FTP (a), FTP (b), ..., and FTP (j) are supplied to the semiconductor device 1.

Figure 6:
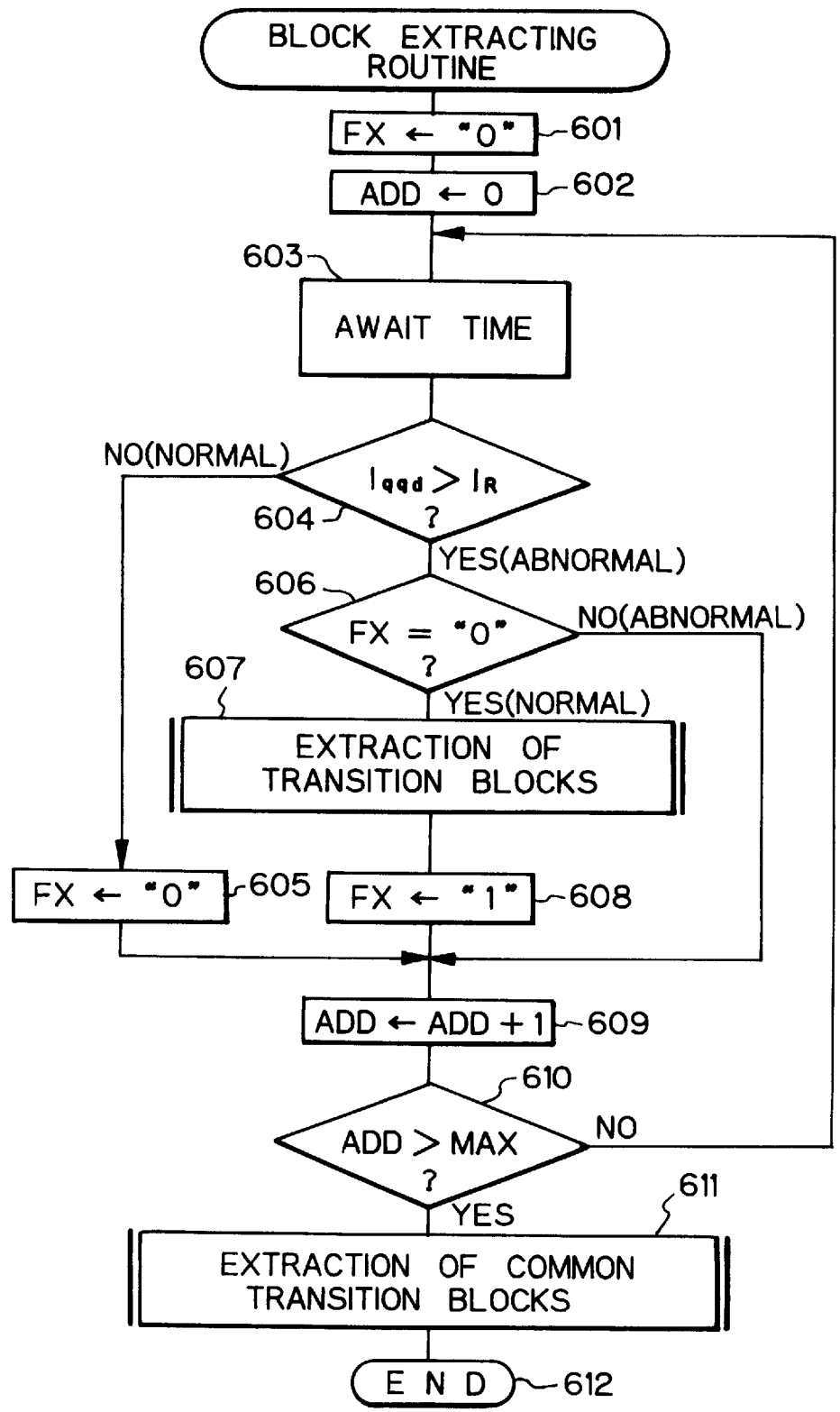
FIG. 6 is a flowchart showing a first operation of the control circuit of FIG. 3.

A first operation of the control circuit 9 is carried out to extract transition blocks when the quiescent $V_{DD}$ supply current $I_{ddq}$ is switched from normal to abnormal, since a fault point is deemed to exist in one or more of the transition blocks. The first operation is shown in FIG. 6.

First, at step 601, a flag FX is reset (FX="0") to show that the current quiscent $I_{DD}$ supply current $I_{ddq}$ is normal. Note that FX="0" means that the a quiescent $V_{DD}$ supply current $I_{ddq}$ is normal, and FX="1" means that the quiescent $V_{DD}$ supply current $I_{ddq}$ is abnormal. Also, at step 602, the address ADD is cleared.

Step 603 waits for a predetermined time period to pass, so that the semiconductor device 1 responds to the functional test pattern FTP of the address ADD to generate a new quiescent $V_{DD}$ supply current $I_{ddq}$. After the predetermined time has passed, the control proceeds to step 604.

At step 604, it is determined whether or not $I_{ddq}>I_R$ (definite value) is satisfied. If $I_{ddq} \leq I_R$, which means that the quiescent $V_{DD}$ supply current $I_{ddq}$ is normal, the control proceeds to step 605 which resets the flag FX. On the other hand, if $I_{ddq}>I_R$, which means that the quiescent $V_{DD}$ supply current $I_{ddq}$ is abnormal, the control proceeds to steps 606 to 608.

At step 606, it is determined whether or not FX is "0". If FX="0", this means that the quiescent $V_{DD}$ supply current $I_{ddq}$ is switched from normal to abnormal. Therefore, at step 607, transition blocks between the functional test pattern FTP (ADD-1) and the functional test pattern FTP (ADD) are extracted with reference to the table as shown in FIG. 4. Then, the control proceeds to step 608 which sets the flag FX. Also, at step 606, if FX ="1", the control proceeds directly to step 609.

Figure 7:
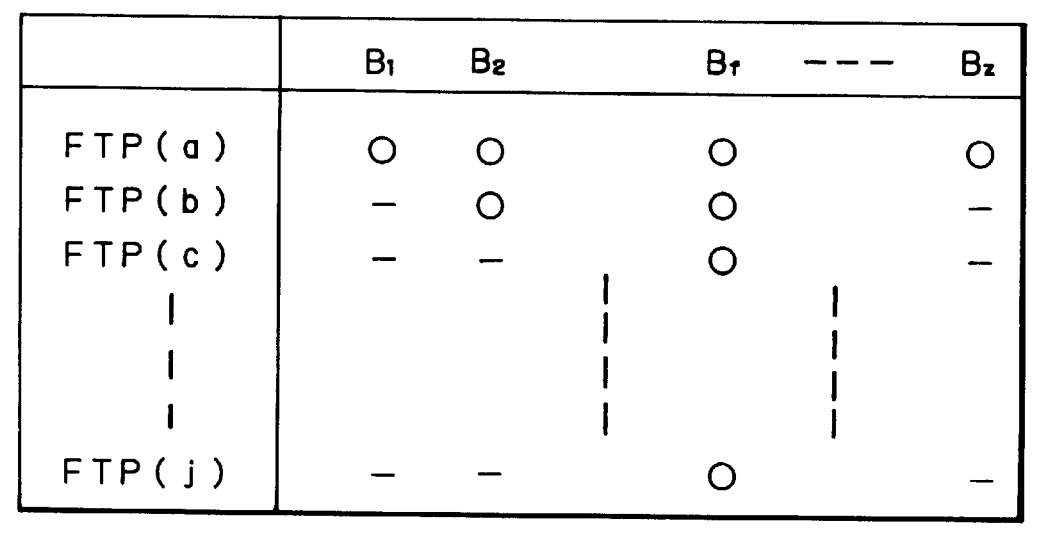

Steps 609 and 610 repeat the operation at steps 603 through 608 until ADD reaches its maximum value MAX. Thus, as shown in FIG. 7, transition blocks are obtained for the functional test patterns FTP (a), FTP (b), FTP (c), FTP (d),FTP (f), FTP (g), FTP (h), FTP (i) and FTP (j) in relation to the functional test patterns FTP (a-1), FTP (b-1), FTP (c-1), FTP (d-1),FTP (f-1), FTP (g-1), FTP (h-1), FTP (i-1) and FTP (j-1) of FIG. 5.

At step 611, common transition blocks are extracted from the transition blocks extracted at step 607. For example, the block $B_f$ is extracted from the transition blocks as shown in FIG. 7.

Then, the routine of FIG. 6 is completed by step 612.

Figure 8:
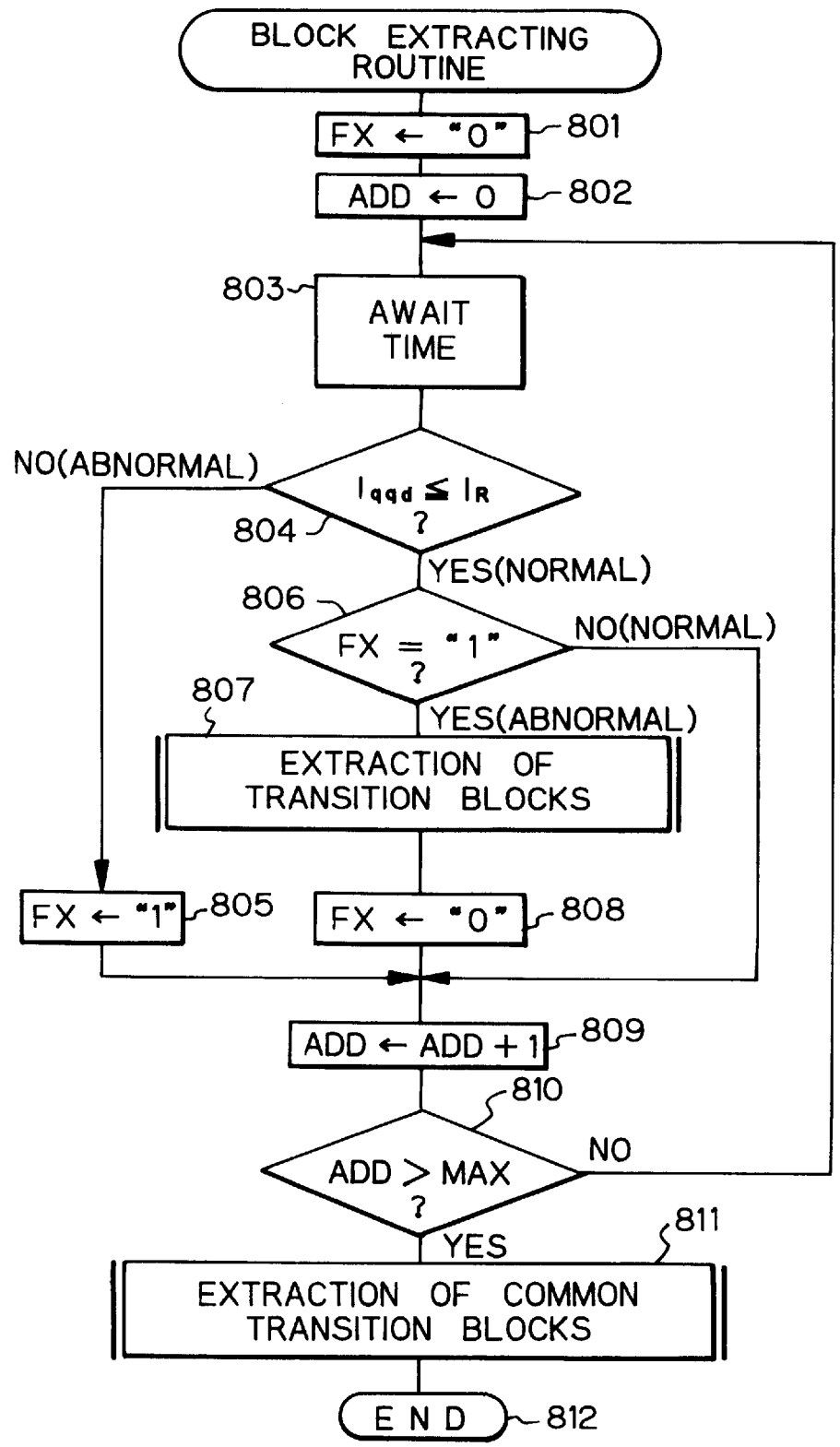
FIG. 8 is a flowchart showing a second operation of the control circuit of FIG. 3.

A second operation of the control circuit 9 is carried out to extract transition blocks when the quiescent $V_{DD}$ supply current $I_{ddq}$ is switched from abnormal to normal, since a fault point is deemed to exist in one or more of the transition blocks. The second operation is shown in FIG. 8.

First, at step 801, a flag FX is reset (FX="0") to show that the current quiescent $I_{DD}$ supply current $I_{ddq}$ is normal. Also, at step 802, the address ADD is cleared.

Step 803 waits for a predetermined time period to pass, so that the semiconductor device 1 responds to the functional test pattern FTP of the address ADD to generate a new quiscent $V_{DD}$ supply current $I_{ddq}$. After the predetermined time has passed, the control proceeds to step 804.

At step 804, it is determined whether or not $I_{ddq} \leq I_R$ is satisfied. If $I_{ddq} > I_R$, which means that the quiescent $V_{DD}$ supply current $I_{ddq}$ is abnormal, the control proceeds to step 805 which sets the flag FX. On the other hand, if $I_{ddq} \leq I_R$, which means that the quiescent $V_{DD}$ supply current $I_{ddq}$ is normal, the control proceeds to step 806 to 808.

At step 806, it is determined whether or not FX is "1". If FX="1", this means that the quiescent $V_{DD}$ supply current ,$I_{ddq}$ is switched from abnormal to normal. Therefore, at step 807, transition blocks between the functional test pattern FTP (ADD-1) and the functional test pattern FTP (ADD) are extracted with reference to the table as shown in FIG. 4. Then, the control proceeds to step 808 which sets the flag FX. Also, at step 806, if FX ="0", the control proceeds directly to step 809.

Steps 809 and 810 repeat the operation at step 803 through 808 until. ADD reaches its maximum value MAX. Thus, transition blocks are obtained for the functional test patterns FTP (a+1), FTP (b+1), FTP (c+1), FTP (e+1) ,FTP (f+1), FTP (g+1), FTP (h+1), FTP (i+1) and FTP (j+1) in relation to the functional test patterns FTP (a), FTP (b), FTP (c), FTP (e),FTP (f), FTP (g), FTP (h), FTP (i) and FTP (j) of FIG. 5.

At step 811, common transition blocks are extracted from the transition blocks extracted at step 807. For example, the block $B_f$ is extracted from the transition blocks.

Then, the routine of FIG. 8 is completed by step 812.

A third operation of the control circuit 9 is carried out to extract transition blocks when the quiescent $V_{DD}$ supply current $I_{ddg}$ is switched from normal to abnormal and vice versa, since a fault point is deemed to be included in any of the transition blocks. The third operation is shown in FIG. 9.

Figure 9:
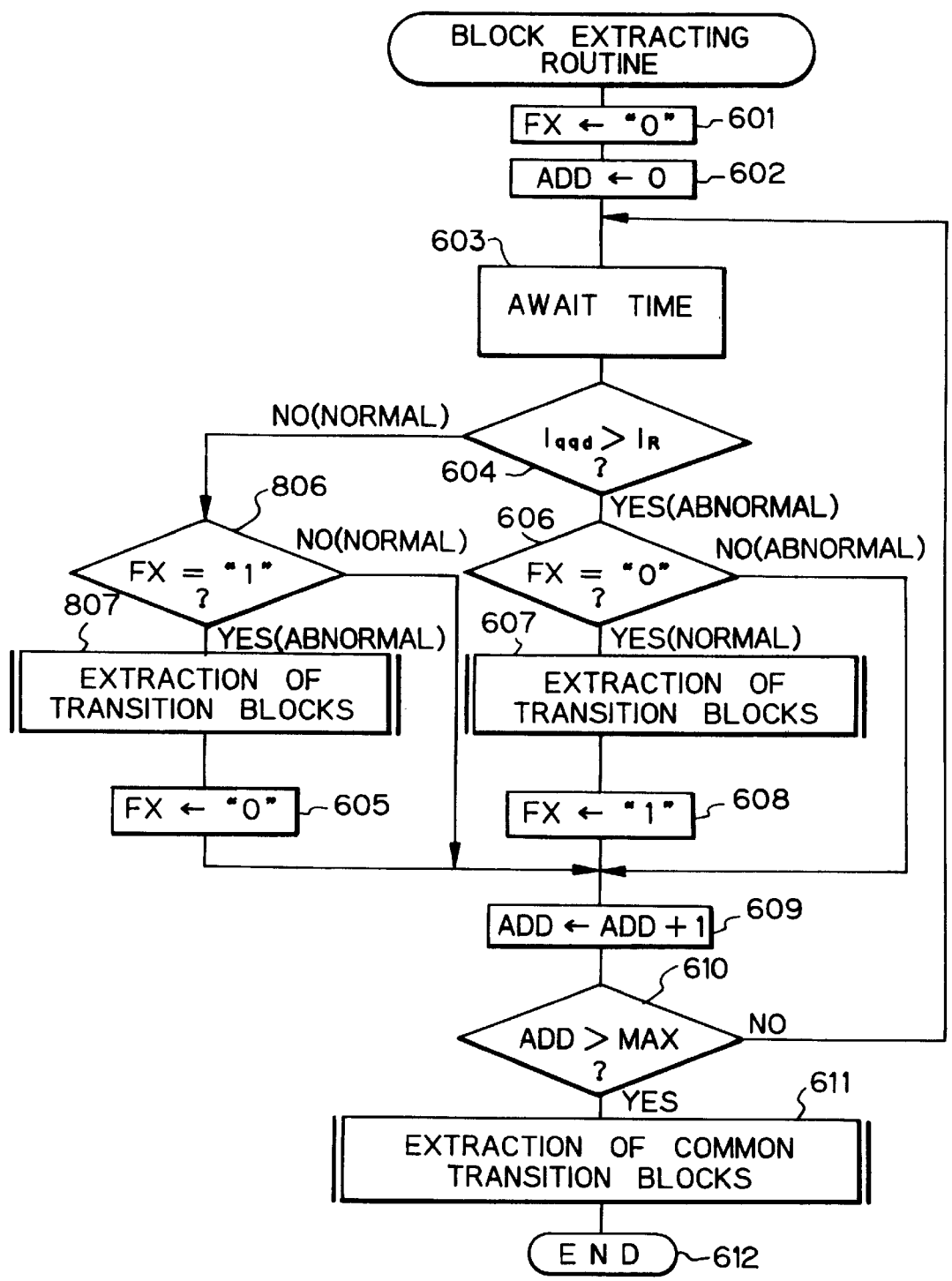
FIG. 9 is a flowchart showing a third operation of the control circuit of FIG. 3.

In FIG. 9, steps 806 and 807 of FIG. 8 are added to the routine of FIG. 6. According to this routine, the number of common transition blocks obtained at step 611 of FIG. 9 can be reduced as compared with the number of common transition blocks obtained at step 611 of FIG. 6 or at step 811 of FIG. 8.

A fourth operation of the control circuit 9 is carried out to extract first transition blocks when the quiescent $V_{DD}$ supply current $I_{ddq}$ is switched from normal to abnormal, and to extract second transition blocks when the quiescent $V_{DD}$ supply current $I_{ddq}$ is successively abnormal. In this case, a fault point is deemed to exist in one or more of the first transition blocks, but is deemed to be excluded from any of the second transition blocks. The fourth operation is shown in FIG. 10.

Figure 10:
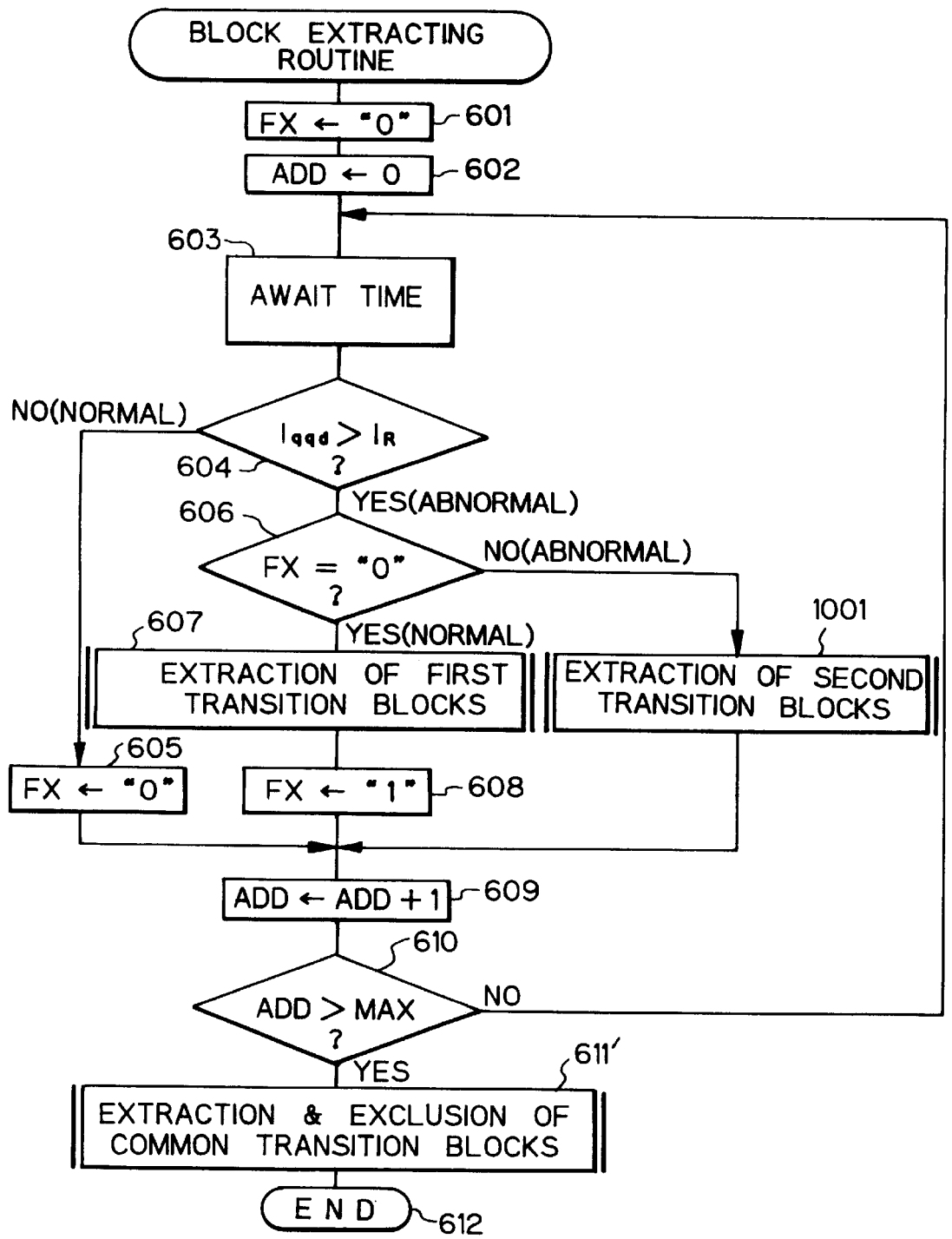
FIG. 10 is a flowchart showing a fourth operation of the control circuit of FIG. 3.

In FIG. 10, step 1001 is added to the routine of FIG. 6, and step 611 of FIG. 6 is modified into step 611'.

That is, when the operation at step 607 is repeated until ADD reaches its maximum value MAX, first transition blocks are obtained for the functional test patterns FTP (a), FTP (b), FTP (c), FTP (d), FTP (f), FTP (g), FTP (h), FTP (i) and FTP (j) in relation to the functional test patterns FTP (a–1), FTP (b–1), FTP (c–1), FTP (d–1), FTP (f–1), FTP (g–1), FTP (h–1), FTP (i–1) and FTP (j–1) of FIG. 5.

Also, when the operation at step 1001 is repeated until ADD reaches MAX, second transition blocks are obtained for the functional test patterns FTP (d+1), FTP (d+2),. . ., FTP (e) in relation to the functional test patterns FTP (d), FTP (d+1),. . ., FTP (e–1) of FIG. 5.

Further, at step 611', common transition blocks are extracted from the first transition blocks extracted at step 607, and also, the second transition blocks extracted at step 1001 are excluded from the common transition blocks.

According to FIG. 10, the number of common transition blocks obtained at step 611' of FIG. 10 can be reduced as compared with the number of common transition blocks obtained at step 611 of FIG. 6.

A fifth operation of the control circuit 9 is carried out to extract first transition blocks when the quiescent $V_{DD}$ supply current $I_{ddq}$ is switched from abnormal to normal, and to extract second transition blocks when the quiescent $V_{DD}$ current $I_{ddq}$ is successively abnormal. Also, in this case, a fault point is deemed to exist in one or more of the first transition blocks, but is deemed to be excluded from any of the second transition blocks. The fifth operation is shown in FIG. 11.

Figure 11:
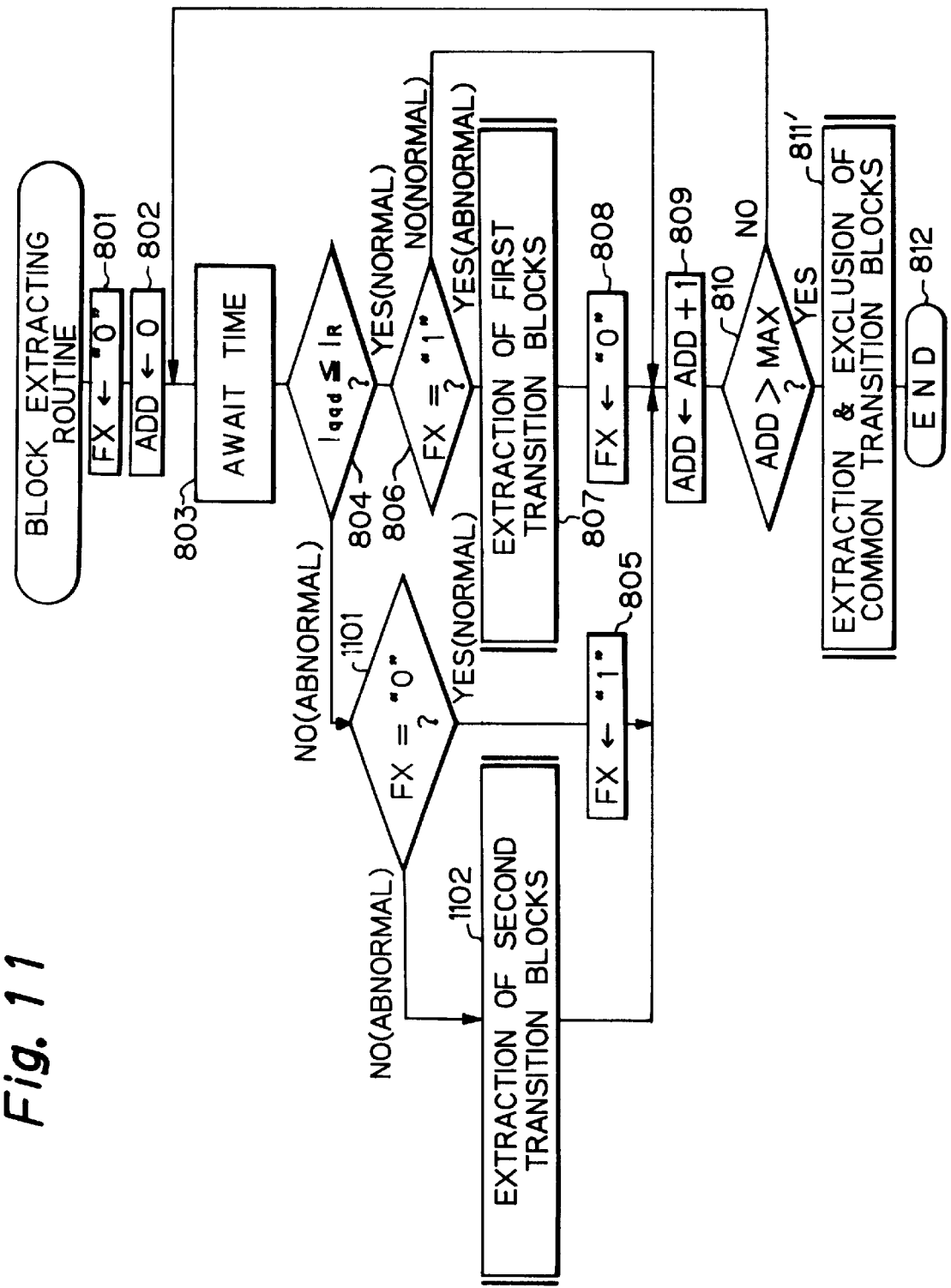
FIG. 11 is a flowchart showing a fifth operation of the control circuit of FIG. 3.

In FIG. 11, steps 1101 and 1102 are added to the routine of FIG. 8, and step 811 of FIG. 8 is modified into step 811'.

That is, when the operation at step 807 is repeated until ADD reaches its maximum value MAX, first transition blocks are obtained for the functional test patterns FTP (a+1), FTP (b+1), FTP (c+1), FTP (e+1), FTP (f+1), FTP (g+1), FTP (h+1), FTP (i+1) and FTP (j+1) in relation to the functional test patterns FTP (a), FTP (b) , FTP (c), FTP (e), FTP (f), FTP (g), FTP (h), FTP (i) and FTP (j) of FIG. 5.

Also, when the operation at step 1102 is repeated until ADD reaches MAX, second transition blocks are obtained for the functional test patterns FTP (d+1), FTP (d+2),. . ., FTP (e) in relation to the functional test patterns FTP (d), FTP (d+1),. . . , FTP (e–1) of FIG. 5.

Further, at step 811', common transition blocks are extracted from the first transition blocks extracted at step 807, and also, the second transition blocks extracted at step 1102 are excluded from the common transition blocks. According to FIG. 11, the number of common transition blocks obtained at step 811' of FIG. 11 can be reduced as compared with the number of common transition blocks obtained at step 811 of FIG. 8.

A sixth operation of the control circuit 9 is carried out to extract first transition blocks when the quiescent $V_{DD}$ supply current $I_{ddq}$ is switched from normal to abnormal and vice versa, and to extract second transition blocks when the quiescent $V_{DD}$ supply current $I_{ddq}$ is successively abnormal. Also, in this case, a fault point is deemed to be included in one or more of the first transition blocks, but is deemed to be excluded from any of the second transition blocks. The sixth operation is shown in FIG. 12.

Figure 12:
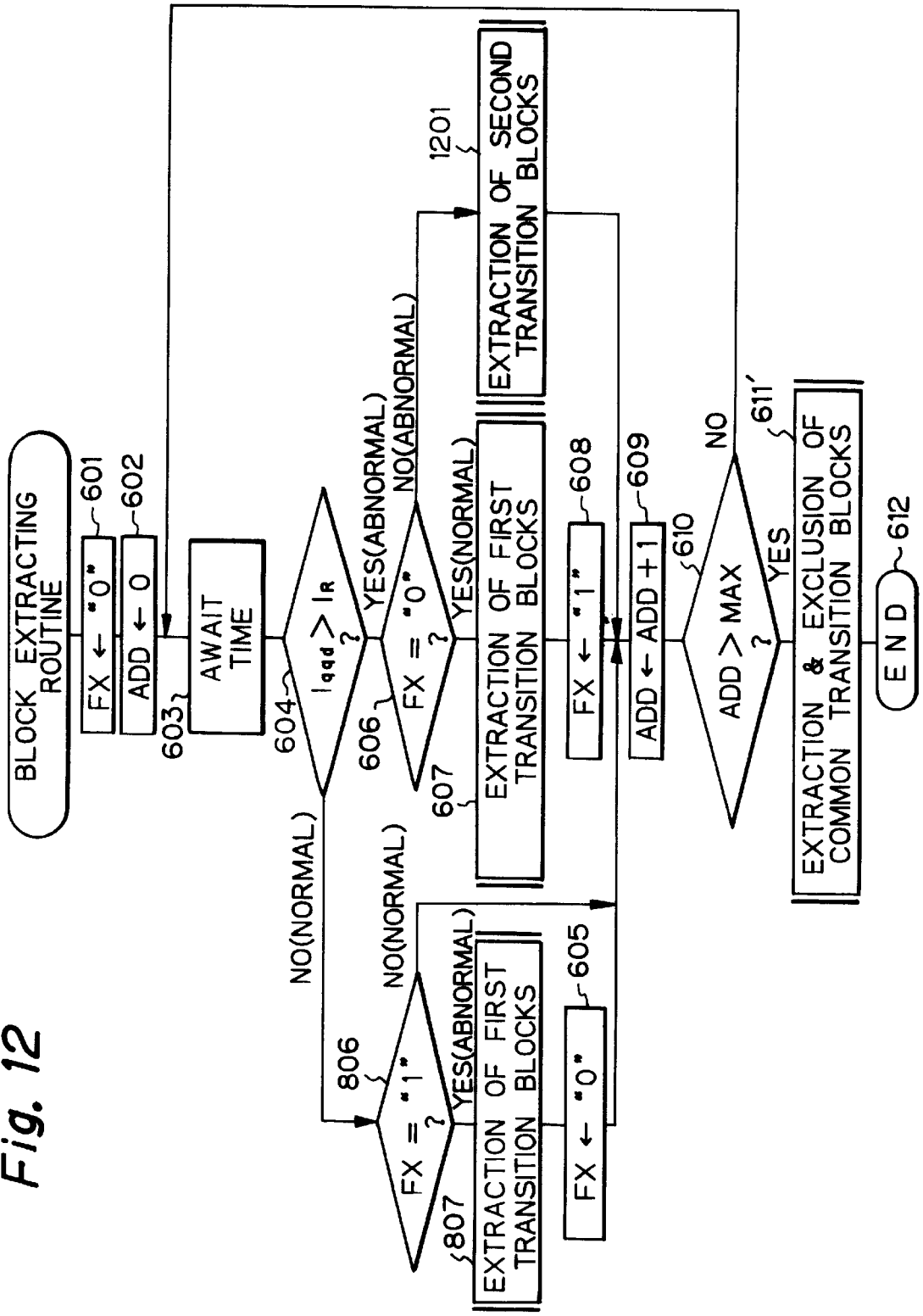
FIG. 12 is a flowchart showing a sixth operation of the control circuit of FIG. 3.

In FIG. 12, step 1201 is added to the routine of FIG. 9, and step 611 of FIG. 9 is modified into step 611'.

That is, when the operations at step 607 and 807 are repeated until ADD reaches its maximum value MAX, first transition blocks are obtained for the functional test patterns FTP (a), FTP (b), FTP (c), FTP (d), FTP (f) , FTP (g) , FTP (h), FTP (i) and FTP (j) in relation to the functional test patterns FTP (a–1), FTP (b–1), FTP (c–1), FTP (d–1), FTP (f–1), FTP (g–1), FTP (h–1), FTP (i–1) and FTP (j–1) of FIG. 5, and the functional test patterns FTP (a+1), FTP (b+1), FTP (c+1), FTP (e+1), FTP (f+1), FTP (g+1), FTP (h+1), FTP (i+1) and FTP (j+1) in relation to the functional test patterns FTP (a), FTP (b), FTP (c), FTP (e), FTP (f), FTP (g), FTP (h), FTP (i) and FTP (j) of FIG. 5. Also, when the operation at step 1201 is repeated until ADD reaches MAX, second transition blocks are obtained for the functional test patterns FTP (d+1), FTP (d+2),. . ., FTP (e) in relation to the functional test patterns FTP (d), FTP (d+1),. . . , FTP (e–1) of FIG. 5.

Further, at step 611' common transition blocks are extracted from the first transition blocks extracted at steps 607 and 807, and also, the second transition blocks extracted at step 1001 are excluded from the common transition blocks. According to FIG. 12, the number of common transition blocks obtained at step 611' of FIG. 12 can be reduced as compared with the number of common transition blocks obtained at step 611 of FIG. 9.

A seventh operation of the control circuit 9 is carried out to extract first transition blocks when the quiescent $V_{DD}$ supply current $I_{ddq}$ is switched from normal to abnormal, and to extract second transition blocks when the quiescent $V_{DD}$ supply current $I_{ddq}$ is successively normal. In this case, a fault point is deemed to exist in one or more of the first transition blocks, but is deemed to be excluded from any of the second transition blocks. The seventh operation is shown in FIG. 13.

Figure 13:
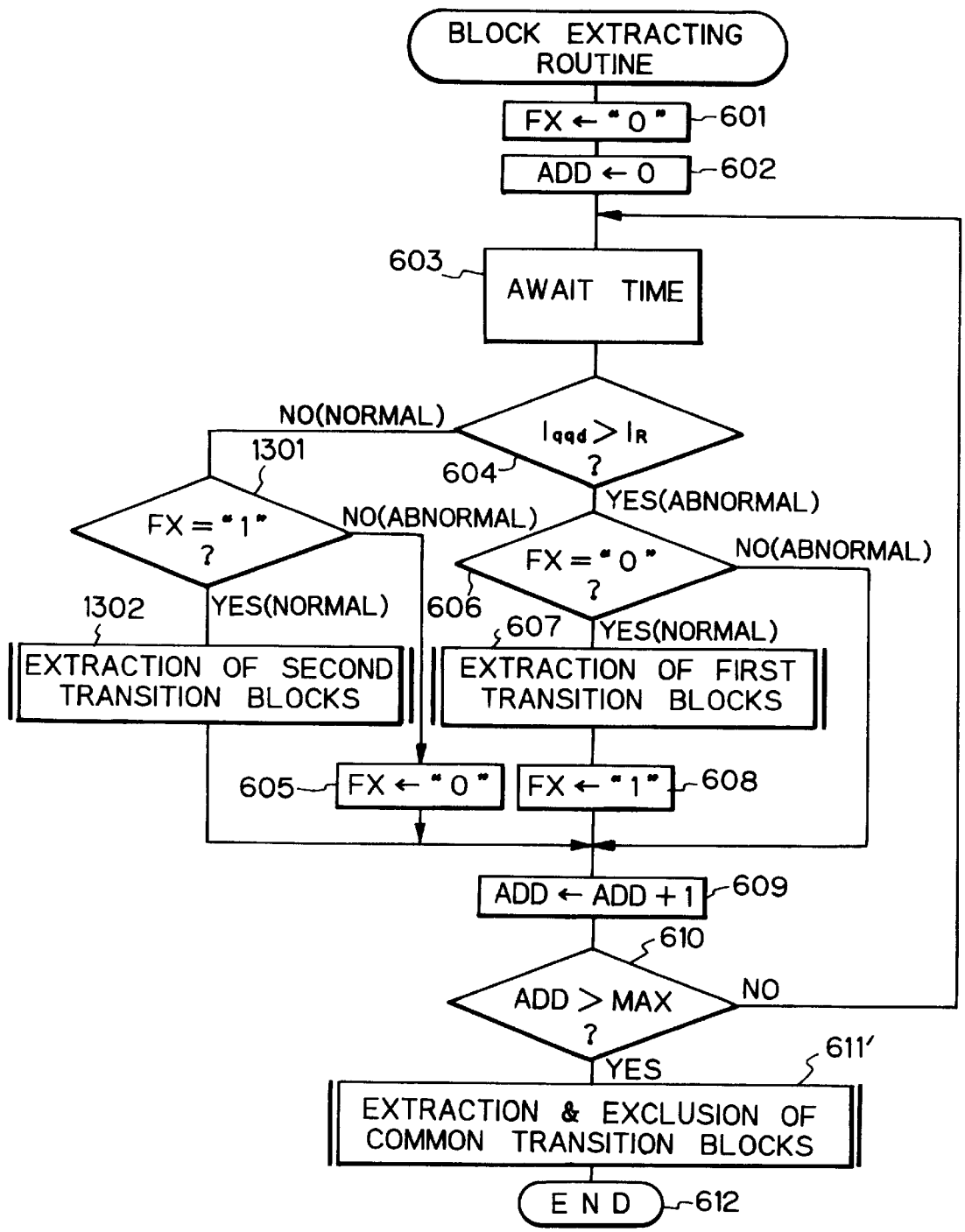
FIG. 13 is a flowchart showing a seventh operation of the control circuit of FIG. 3.

In FIG. 13, steps 1301 and 1302 are added to the routine of FIG. 6, and step 611 of FIG. 6 is modified into step 611'.

That is, when the operation at step 607 is repeated until ADD reaches its maximum value MAX, first transition blocks are obtained for the functional test patterns FTP (a), FTP (b), FTP (c), FTP (d), FTP (f), FTP (g), FTP (h), FTP (i) and FTP (j) in relation to the functional test patterns FTP (a–1), FTP (b–1), FTP (c–1), FTP (d–1), FTP (f–1), FTP (g–1), FTP (h–1), FTP (i–1) and FTP ( j–1) of FIG. 5.

Also, when the operation at step 1302 is repeated until ADD reaches MAX, second transition blocks are obtained for the functional test patterns FTP (1), FTP (2),. . . in relation to the functional test patterns FTP (0), FTP (1),. . . of FIG. 5.

Further, at step 611', common transition blocks are extracted from the first transition blocks extracted at step 607, and also, the second transition blocks extracted at step 1302 are excluded from the common transition blocks. Also, according to FIG. 13, the number of common transition blocks obtained at step 611' of FIG. 13 can be reduced as compared with the number of common transition blocks obtained at step 611 of FIG. 6.

An eighth operation of the control circuit 9 is carried out to extract first transition blocks when the quiescent $V_{DD}$ supply current $I_{ddq}$ is switched from abnormal to normal, and to extract second transition blocks when the quiescent $V_{DD}$ current $I_{ddq}$ is successively normal. Also, in this case, a fault point is deemed to exist in one or more of the first transition blocks, but is deemed to be excluded from any of the second transition blocks. The eighth operation is shown in FIG. 14.

Figure 14:
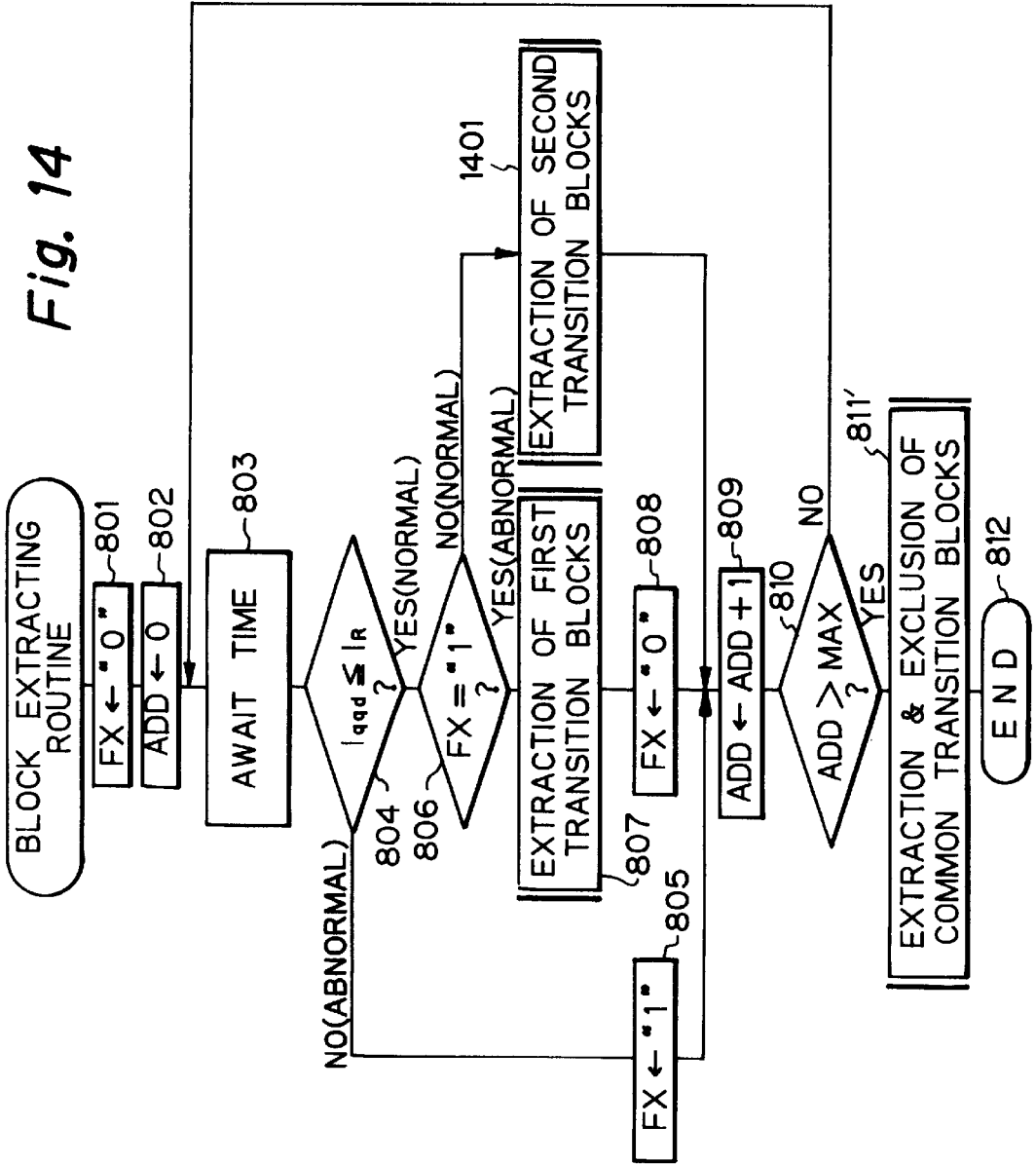
FIG. 14 is a flowchart showing an eighth operation of the control circuit of FIG. 3.

Tn FIG. 14, step 1401 is added to the routine of FIG. 8, and step 811 of FIG. 8 is modified into step 811'.

That is, when the operation at step 807 is repeated until ADD reaches its maximum value MAX, first transition blocks are obtained for the functional test patterns FTP (a+1), FTP (b+1), FTP (c+1), FTP (e+1), FTP (f+1), FTP (g+1), FTP (h+1), FTP (i+1) and FTP (j+1) in relation to the functional test patterns FTP (a), FTP (b) , FTP (c), FTP (e), FTP (f), FTP (g), FTP (h), FTP (i) and FTP (j) of FIG. 5.

Also, when the operation at step 1401 is repeated until ADD reaches MAX, second transition blocks are obtained for the functional test patterns FTP (1), FTP (2),. . . in relation to the functional test patterns FTP (0), FTP (1),. . . of FIG. 5.

Further, at step 811', common transition blocks are extracted from the first transition blocks extracted at step 807, and also, the second transition blocks extracted at step 1401 are excluded from the common transition blocks. Also, according to FIG. 14, the number of common transition blocks obtained at step 811' of FIG. 14 can be reduced as compared with the number of common transition blocks obtained at step 811 of FIG. 8.

A ninth operation of the control circuit 9 is carried out to extract first transition blocks when the quiescent $V_{DD}$ supply current $I_{ddq}$ is switched from normal to abnormal and vice versa, and to extract second transition blocks when the quiescent $V_{DD}$ supply current $I_{ddq}$ is successively normal. Also, in this case, a fault point is deemed to be included in one or more of the first transition blocks, but is deemed to be excluded from any of the second transition blocks. The ninth operation is shown in FIG. 15.

Figure 15:
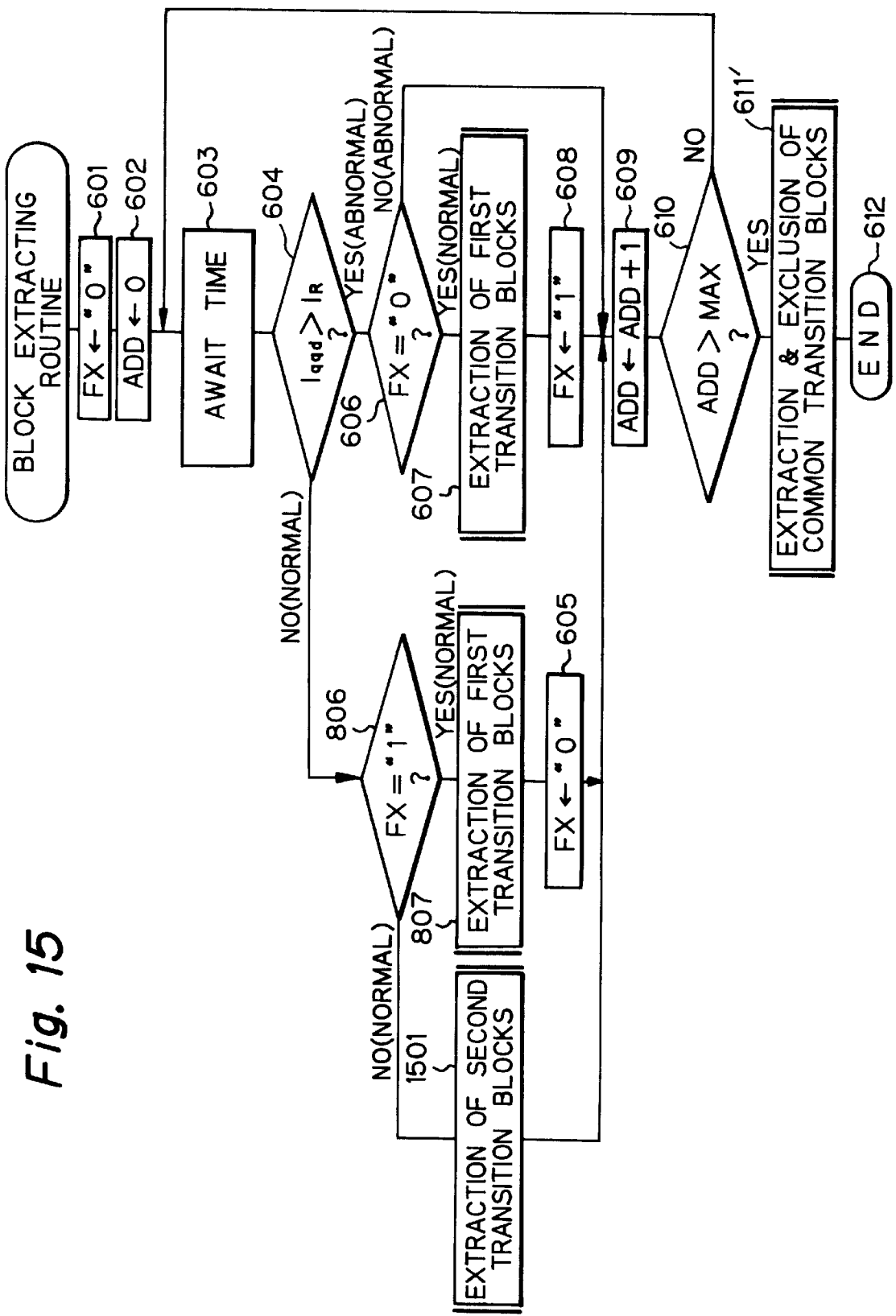
FIG. 15 is a flowchart showing a ninth operation of the control circuit of FIG. 3.

In FIG. 15, step 1501 is added to the routine of FIG. 9, and step 611 of FIG. 9 is modified into step 611'.

That is, when the operations at step 607 and 807 are repeated until ADD reaches its maximum value MAX, first transition blocks are obtained for the functional test patterns FTP (a), FTP (b), FTP (c), FTP (d), FTP (f) , FTP (g), FTP (h), FTP (i) and FTP (j) in relation to the functional test patterns FTP (a–1), FTP (b–1), FTP (c–1), FTP (d–1), FTP (f–1), FTP (g–1), FTP (h–1), FTP (i–1) and FTP (j–1) of FIG. 5, and the functional test patterns FTP (a+1), FTP (b+1), FTP (c+1), FTP (e+1), FTP (f+1), FTP (g+1), FTP (h+1), FTP (1+1) and FTP (j+1) in relation to the functional test patterns FTP (a), FTP (b), FTP (c), FTP (e), FTP (f), FTP (g), FTP (h), FTP (i) and FTP (j) of FIG. 5. Also, when the operation at step 1501 is repeated until ADD reaches MAX, second transition blocks are obtained for the functional test patterns FTP (1), FTP (2),. . . in relation to the functional test patterns FTP (0), FTP (1),. . . of FIG. 5.

Further, at step 611', common transition blocks are extracted from the first transition blocks extracted at steps 607 and 807, and also, the second transition blocks extracted at step 1501 are excluded from the common transition blocks. Also, according to FIG. 15, the number of common transition blocks obtained at step 611' of FIG. 15 can be reduced as compared with the number of common transition blocks obtained at step 611 of FIG. 9.

In the above-described operations as shown in FIGS. 6, 8 and 9, the extraction of transition blocks at steps 607 and 807 is carried out separately with the extraction of common transition blocks at steps 611 and 811. However, these two kinds of extractions can be simultaneously carried out. so that effective use is made of the RAM of the control circuit 9. For example, for this purpose, the routine of FIG. 6 is modified into a routine of FIG. 16.

Figure 16:
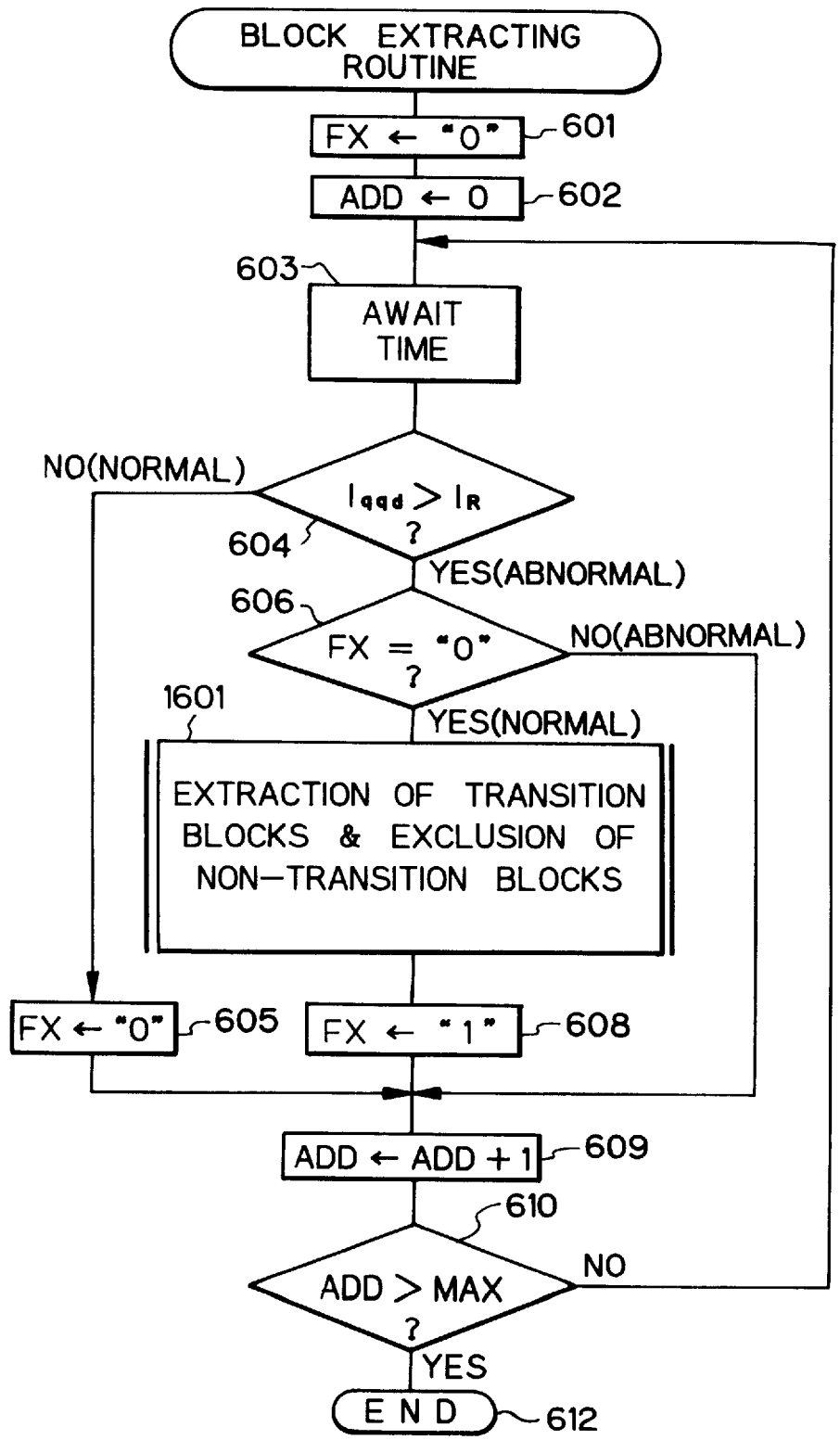
FIG. 16 is a flowchart showing a tenth operation of the control circuit of FIG. 3.

In FIG. 16, step 1601 is provided instead of step 607 of FIG. 6, and step 611 of FIG. 6 is deleted. That is, when ADD=a, at step 1601, transition blocks $B_1$, $B_2$, $B_6$, $B_a$, $B_p$,. . . , $B_z$ between the functional test patterns FTP (a–1) and FTP (a) are extracted and are stored in the RAM as indicated by an arrow I in FIG. 17. Next, when ADD=b, at step 1601, transition blocks $B_2$, $B_p$,. . . , between the functional test patterns FTP (b–1) and FTP (b) are extracted and the non-transition blocks $B_1$, $B_6$, $B_a$,. . . ,$B_z$ are excluded from the RAM as indicated by an arrow II in FIG. 17. Next, when ADD=c, at step 1601, transition blocks $B_p$,. . . , between the functional test patterns FTP (c–1) and FTP (c) are extracted and the non-transition blocks $B_2$,. . . , are excluded from the RAM as indicated by an arrow III in FIG. 17.

Finally, when ADD=j, at step 1601, the block $B_f$ remains in the RAM as indicated by an arrow IV in FIG. 17.

Thus, the fault block $B_f$ is detected by the routine of FIG. 13 in a similar way to that, in the routine of FIG. 6.

Also, in the above-described operations as shown in FIGS. 10, 11 and 12, the extraction of transition blocks at steps 607, 807 and 1201 is carried out separately with the extraction and exclusion of transition blocks at steps 611' and 811'. However, these two kinds of operations can be simultaneously carried out. so that effective use is made of the RAM of the control circuit 9. For example, for this purpose, the routine of FIG. 10 is modified into a routine of FIG. 18.

Figure 18:
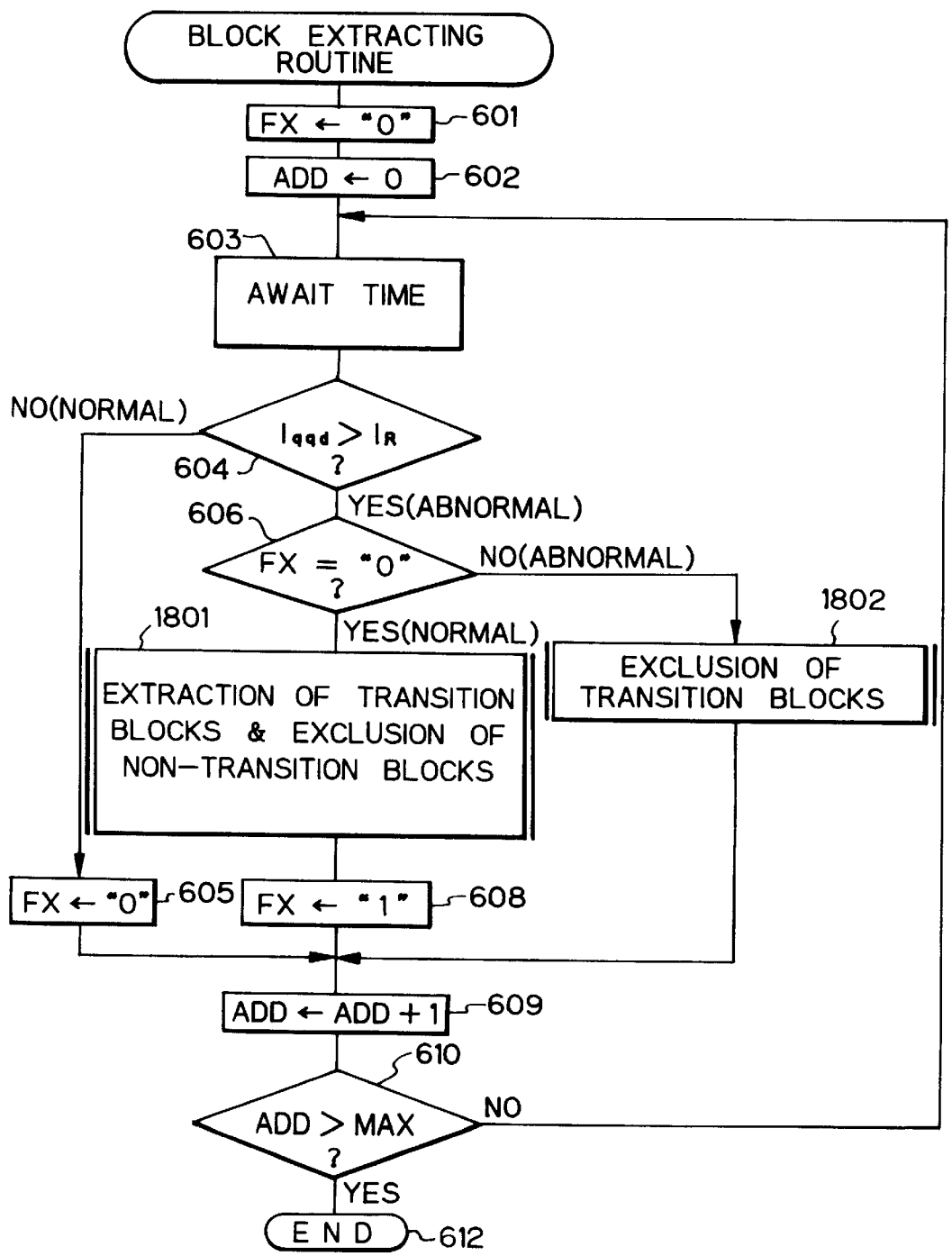
FIG. 18 is a flowchart showing an eleventh operation of the control circuit of FIG. 3.

In FIG. 18, steps 1801 and 1802 are provided instead of steps 607 and 1001, respectively, of FIG. 10, and step 611' of FIG. 10 is deleted. That is, when ADD =a, at step 1801, transition blocks $B_1, B_2, B_6, B_a, B_f, \ldots, B_i, \ldots, B_z$ between the functional test patterns FTP (a+1) and FTP (a) are extracted and are stored in the RAM as indicated by an arrow I in FIG. 19. Next, when ADD =b, at step 1801, transition blocks $B_2, B_a, B_f, \ldots$, between the functional test patterns FTP (b−1) and FTP (b) are extracted and the non-transition blocks $B_1, B_6, \ldots$, are excluded from the RAM as indicated by an arrow II in FIG. 19. Next, when ADD=d+1, at step 1802, transition blocks $B_f, \ldots$, between the functional test patterns FTP (d+1) and FTP (d) are extracted and the non-transition blocks $B_i, \ldots, B$, are excluded from the RAM as indicated by an arrow III in FIG. 19.

Finally, when ADD=j, at step 1501, the block $B_f$ remains in the RAM as indicated by an arrow IV in FIG. 19.

Thus, the fault block $B_f$ is detected by the routine of FIG. 15 in a similar way to that in the routine of FIG. 6.

Figure 20:
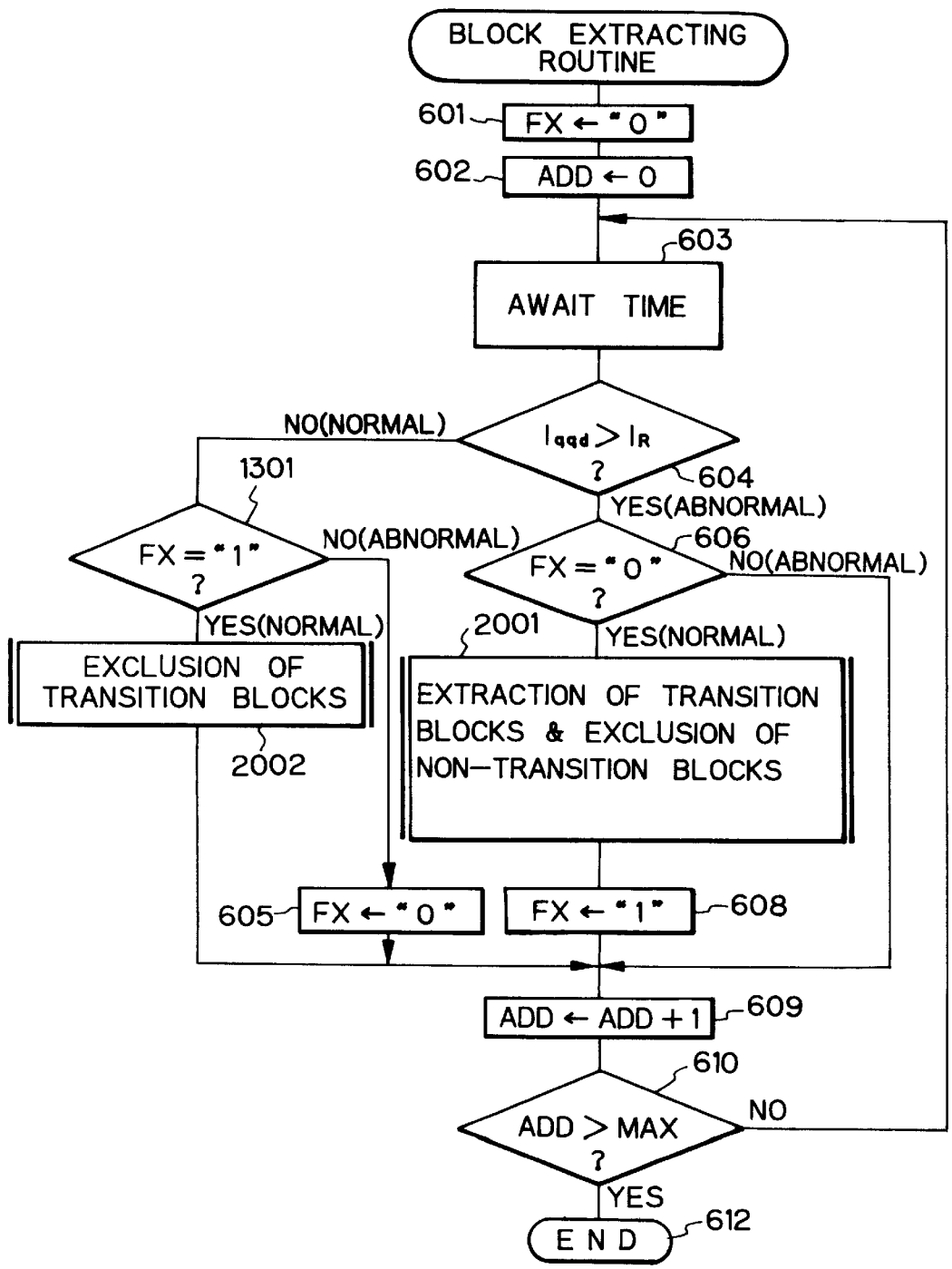
FIG. 20 is a flowchart showing a twelfth operation of the control cirucit of FIG. 3.

Further, in the above-described operations as shown in FIGS. 13, 14 and 15, the extraction of transition blocks at steps 607, 807 and 1501 is carried out separately with the extraction and exclusion of transition blocks at steps 611' and 811'. However, these two kinds of operations can be simultaneously carried out. so that effective use is made of the RAM of the control circuit 9. For example, for this purpose, the routine of FIG. 13 is modified into a routine of FIG. 20. In FIG. 20, steps 2001 and 2002 are provided instead of steps 607 and 1302, respectively, of FIG. 13, and step 611' of FIG. 13 is deleted.

Figure 21A:
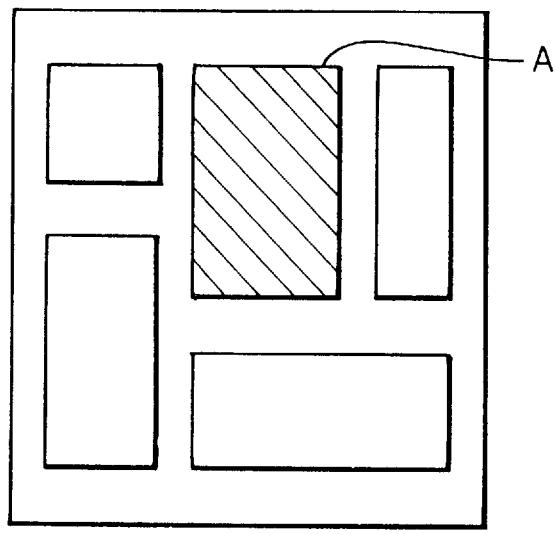
FIGS. 21A, 21B and 21C are diagrams for explaining a testing system to which the present invention is applied.
Figure 21B:
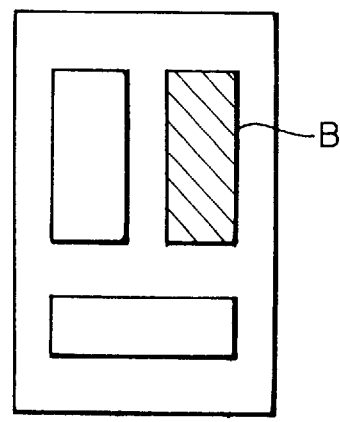
Figure 21C:
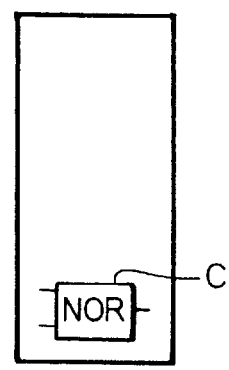

The present invention can be applied to a hierarchic testing system as illustrated in FIGS. 21A, 21B and 21C. First, one of the above-described embodiments is applied to a semiconductor device which is divided into a plurality of large blocks as illustrated in FIG. 21A, so that a fault block A is found. Next, one of the above-described embodiments is applied to the fault block A which is sub-divided into a plurality of small blocks as illustrated in FIG. 21B, so that a fault sub-block B is found. Finally, a logic simulation is carried out to find a basic logic circuit C such as a NOR circuit as a fault point as illustrated in FIG. 21C.

As explained hereinbefore, according to the present invention, since a fault block within a semiconductor device is determined by using a quiescent $V_{DD}$ supply current in response to functional test patterns, a fault point within the semiconductor device, i.e., a fault point within the fault block can be detected without using a large fault dictionary.

I claim:

1. A system for detecting a fault block in a semiconductor device formed by a plurality of logic blocks, comprising:

a table means for storing a relationship between a plurality of functional test patterns and operable logic blocks among said logic blocks operated on by said plurality of functional test patterns;

means for sequentially generating said plurality of functional test patterns and transmitting said plurality of functional test patterns to said semiconductor device;

means for detecting whether a current, produced by said plurality of functional test patterns and flowing through said semiconductor device, is larger than a certain value;

means for determining whether said semiconductor device is switched from normal to abnormal in accordance with the current detected by said means for detecting;

a first transition block extracting means for extracting transition blocks from among said operable logic blocks in accordance with said table means each time said semiconductor device is switched from normal to abnormal; and a fault block extracting means for extracting at least one common block as said fault block from among a plurality of groups of said transition blocks extracted by said first transition block extracting means.

2. The system as set forth in claim 1, further comprising:

means for determining whether said semiconductor device is switched from abnormal to normal in accordance with the current detected by said means for detecting; and a second transition block extracting means for extracting transition blocks from among said operable logic blocks in accordance with said table means each time said semiconductor device is switched from abnormal to normal; and wherein said fault block extracting means extracts at least one common block as said fault block among a plurality of groups of said transition blocks extracted by said first and second transition block extracting means.

3. The system as set forth in claim 1, further comprising:

means for determining whether said semiconductor device is successively abnormal in accordance with the current detected by said means for detecting; and another transition block extracting means for extracting transition blocks from among said operable logic blocks in accordance with said table means each time said semiconductor device is successively abnormal, wherein said fault block extracting means excludes said transition blocks extracted by said another transition block extracting means from said at least one common block.

4. The system as set forth in claim 2, further comprising:

means for determining whether said semiconductor device is successively abnormal in accordance with the current detected by said means for detecting; and a third transition block extracting means for extracting transition blocks from among said operable logic blocks in accordance with said table means each time said semiconductor device is successively abnormal, wherein said fault block extracting means excludes said transition blocks extracted by said third transition block extracting means from said at least one common block.

5. The system as set forth in claim 1, further comprising:

means for determining whether said semiconductor device is successively normal in accordance with the current detected by said means for detecting; and another transition block extracting means for extracting transition blocks from among said logic blocks in accordance with said table means each time said semiconductor device is successively normal, wherein said fault block extracting means excludes said transition blocks extracted by said another transition block extracting means from said at least one common block.

6. The system as set forth in claim 2, further comprising:

means for determining whether said semiconductor device is successively normal in accordance with the current detected by said means for detecting; and a third transition block extracting means for extracting transition blocks from among said operable logic blocks in accordance with said table means each time said semiconductor device is successively normal, wherein said fault block extracting means excludes said transition blocks extracted by said third transition block extracting means from said at least one common block.

7. A system for detecting a fault block in a semiconductor device formed by a plurality of logic blocks, comprising:
- a table means for storing a relationship between a plurality of functional test patterns and said logic blocks operated on by said plurality of functional test patterns;
- means for sequentially generating said plurality of functional test patterns and transmitting said plurality of functional test patterns to said semiconductor device;
- means for detecting whether a current, produced by said plurality of functional test patterns and flowing through said semiconductor device, is larger than a certain value;
- means for determining whether said semiconductor device is switched from normal to abnormal in accordance with the current detected by said means for detecting;
- a first transition block extracting means for extracting first transition blocks from among said logic blocks in accordance with said table means when said semiconductor device is switched from normal to abnormal for a first time; and
- a second transition block extracting means for extracting non-transition blocks from among said logic blocks in accordance with said table means when said semiconductor device is switched from normal to abnormal after said first transition block extracting means extracts said first transition blocks,
- said second transition block extracting means excluding said non-transition blocks from said first transition blocks, to obtain said fault block in said first transition blocks.

8. A system for detecting a fault block in a semiconductor device formed by a plurality of logic blocks, comprising:
- a table means for storing a relationship between a plurality of functional test patterns and said logic blocks operated on by said Plurality of functional test patterns;
- means for sequentially generating said plurality of functional test patterns and transmitting said plurality of functional test patterns to said semiconductor device;
- means for detecting whether a current, produced by said plurality of functional test patterns and flowing through said semiconductor device, is larger than a certain value;
- means for determining whether said semiconductor device is switched from normal to abnormal in accordance with the current detected by said means for detecting;
- a first transition block extracting means for extracting first transition blocks from among said logic blocks in accordance with said table means when said semiconductor device is switched from abnormal to normal for a first time; and
- a second transition block extracting means for extracting non-transition blocks from among said logic blocks in accordance with said table means when said semiconductor device is switched from abnormal to normal after said first transition block extracting means extracts said first transition blocks,
- said second transition block extracting means excluding said non-transition blocks among said first transition blocks, to obtain said fault block in said first transition blocks.

9. The system as set forth in claim 7, further comprising:
- means for determining whether said semiconductor device is successively abnormal in accordance with the current detected by said means for detecting; and
- a third transition block extracting means for extracting second transition blocks from among said logic blocks in accordance with said table means each time said semiconductor device is successively abnormal,
- said third transition block extracting means excluding said second transition blocks extracted by said third transition block extracting means from said first transition blocks.

10. The system as set forth in claim 8, further comprising:
- means for determining whether said semiconductor device is successively abnormal in accordance with the current detected by said means for detecting; and
- a third transition block extracting means for extracting second transition blocks from among said logic blocks in accordance with said table means each time said semiconductor device is successively abnormal,
- said third transition block extracting means excluding said second transition blocks extracted by said third transition block extracting means from said first transition blocks.

11. The system as set forth in claim 7, further comprising:
- means for determining whether said semiconductor device is successively normal in accordance with the curren0t detected by said means for detecting; and
- a third transition block extracting means for extracting second transition blocks from among said logic blocks in accordance with said table means each time said semiconductor device is successively normal,
- said third transition block extracting means excluding said second transition blocks extracted by said third transition block extracting means from said first transition blocks.

12. The system as set forth in claim 8, further comprising:
- means for determining whether said semiconductor device is successively normal in accordance with the current detected by said means for detecting; and
- a third transition block extracting means for extracting second transition blocks from among said logic blocks in accordance with said table means each time said semiconductor device is successively normal,
- said third transition block extracting means excluding said second transition blocks extracted by said third transition block extracting means from said first transition blocks.

13. A method for detecting a faulty logic block in a plurality of logic blocks in a semiconductor, said method comprising the steps of:
- (a) storing a relationship between a plurality of functional test patterns and sets of the plurality of logic blocks, wherein the relationship defines which set of the plurality of logic blocks each of the plurality of functional test patterns actually tests;
- (b) generating one of the plurality of test patterns to test a corresponding set of the plurality of logic blocks;
- (c) detecting an output current of the semiconductor caused by the one of the plurality of test patterns;
- (d) determining if said output current is above a threshold value;
- (e) extracting the set of the plurality of logic blocks if a predetermined relationship between the output current and the threshold value is met;

(f) returning to step (b) until all of the plurality of teat patterns are generated;

(g) extracting at least one common logic block from all of the extracted sets of the plurality of logic blocks, as the faulty logic block.

14. A method of detecting a faulty logic block according to claim 13, wherein step (d) further comprises a step of classifying the output current as "abnormal" when the output current is above the threshold value, and "normal" when the output current is below the threshold value; and wherein the predetermined relationship of step (e) is at least one of the following:
  (i) a transition from a "normal" classification to an "abnormal" classification,
  (ii) a transition from an "abnormal" classification to a "normal" classification,
  (iii) a transition from a "normal" classification to an "abnormal" classification and vise versa,
  (iv) successively "abnormal" classifications, and
  (v) successively "normal" classifications.

* * * * *